United States Patent
Joshi et al.

(10) Patent No.: US 9,184,377 B2
(45) Date of Patent: Nov. 10, 2015

(54) RESISTANCE VARIABLE MEMORY CELL STRUCTURES AND METHODS

(71) Applicant: Micron Technology, Inc., Boise, ID (US)

(72) Inventors: Sachin V. Joshi, Boise, ID (US); F Daniel Gealy, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 101 days.

(21) Appl. No.: 13/915,228

(22) Filed: Jun. 11, 2013

(65) Prior Publication Data

US 2014/0361238 A1   Dec. 11, 2014

(51) Int. Cl.
*H01L 21/62* (2006.01)
*H01L 45/00* (2006.01)
*H01L 27/24* (2006.01)

(52) U.S. Cl.
CPC ............. *H01L 45/06* (2013.01); *H01L 27/2409* (2013.01); *H01L 27/2463* (2013.01); *H01L 45/1233* (2013.01); *H01L 45/165* (2013.01); *H01L 45/1641* (2013.01); *H01L 45/1675* (2013.01)

(58) Field of Classification Search
CPC ....... H01L 45/06; H01L 45/16; H01L 45/126; H01L 45/1233; H01L 21/62; H01L 45/1641; H01L 45/1675; H01L 45/165; H01L 27/2463; H01L 27/2409

See application file for complete search history.

(56) References Cited

U.S. PATENT DOCUMENTS

| | | | |
|---|---|---|---|
| 7,385,245 B2 | 6/2008 | Bhattacharyya | |
| 7,422,926 B2 | 9/2008 | Pellizzer et al. | |
| 7,759,237 B2 | 7/2010 | Ahn et al. | |
| 7,952,937 B2 | 5/2011 | Bode | |
| 2010/0046285 A1* | 2/2010 | Lung | 365/163 |
| 2010/0195371 A1 | 8/2010 | Ohba et al. | |
| 2010/0308296 A1 | 12/2010 | Pirovano et al. | |
| 2011/0095255 A1* | 4/2011 | Sumino et al. | 257/2 |
| 2012/0097911 A1* | 4/2012 | Quick et al. | 257/2 |
| 2013/0181182 A1* | 7/2013 | Perniola et al. | 257/4 |
| 2013/0181183 A1* | 7/2013 | Pellizzer et al. | 257/5 |

OTHER PUBLICATIONS

Related U.S. Appl. No. 13/352,680, entitled, "Resistive Memory Cell Structures and Methods" filed Jan. 18, 2012, (40 pgs.).

* cited by examiner

*Primary Examiner* — Tan N Tran
*Assistant Examiner* — Fazli Erdem
(74) *Attorney, Agent, or Firm* — Brooks, Cameron & Huebsch, PLLC

(57) ABSTRACT

Resistance variable memory cell structures and methods are described herein. A number of embodiments include a first resistance variable memory cell comprising a number of resistance variable materials in a super-lattice structure and a second resistance variable memory cell comprising the number of resistance variable materials in a homogeneous structure.

12 Claims, 5 Drawing Sheets

RESISTANCE VARIABLE MEMORY CELL STRUCTURES AND METHODS

TECHNICAL FIELD

The present disclosure relates generally to apparatuses, such as semiconductor memory devices, systems, and controllers, and related methods, and more particularly, to resistance variable memory cell structures.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), flash memory, and resistance variable memory, among others. Types of resistance variable memory include programmable conductor memory, phase change random access memory (PCRAM), resistive random access memory (RRAM), magnetoresistive random access memory (MRAM; also referred to as magnetic random access memory), conductive-bridging random access memory (CBRAM), and spin torque transfer random access memory (STT RAM), among others.

Non-volatile memory may be used in, for example, personal computers, portable memory sticks, solid state drives (SSDs), personal digital assistants (PDAs), digital cameras, cellular telephones, portable music players, e.g., MP3 players, and movie players, among other electronic devices.

Resistance variable memory, such as PCRAM, includes resistance variable memory cells that can store data based on the resistance state of a storage element, e.g., a memory element having a variable resistance. As such, resistance variable memory cells can be programmed to store data corresponding to a target data state by varying the resistance level of the memory element. Resistance variable memory cells can be programmed to a target data state, e.g., corresponding to a particular resistance level, by applying a programming signal to the resistance variable memory cells. Programming signals can include applying sources of an electrical field or energy, such as positive or negative electrical pulses (e.g., positive or negative voltage or current pulses) to the cells, e.g., to the memory element of the cells, for a particular duration.

A resistance variable memory cell can be programmed to one of a number of data states. For example, a single level cell (SLC) may be programmed to one of two data states, a low resistance state that corresponds to a set state (e.g., logic 1), or a high resistance state that corresponds to a reset state (e.g., logic 0). The data state of the memory cell can depend on whether the cell is programmed to a resistance above or below a particular level. As an additional example, various resistance variable memory cells can be programmed to one of multiple different data states corresponding to different resistance levels. Such cells may be referred to as multi state cells, multi-digit cells, and/or multilevel cells (MLCs), and can represent multiple binary digits of data (e.g., 10, 01, 00, 11, 111, 101, 100, 1010, 1111, 0101, 0001, etc.).

DETAILED DESCRIPTION

Figure 1:
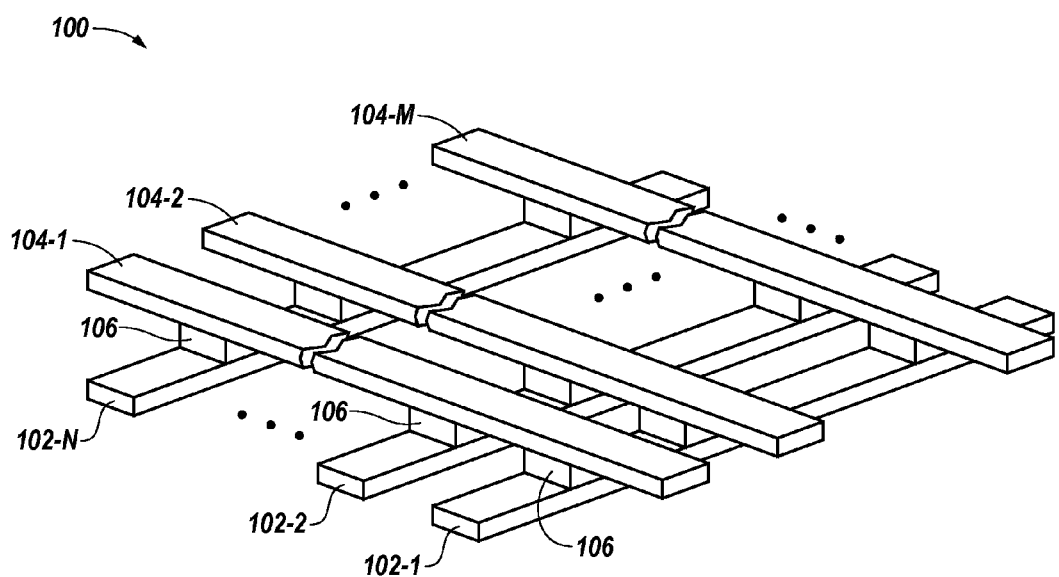
FIG. 1 is a perspective view of a portion of an array of resistance variable memory cells according to a number of embodiments of the present disclosure.

Resistance variable memory cell structures and methods are described herein. A number of embodiments include a first resistance variable memory cell comprising a number of resistance variable materials in a super-lattice structure and a second resistance variable memory cell comprising the number of resistance variable materials in a homogeneous structure.

A number of embodiments can include an array of resistance variable memory cells having a number of portions of memory cells comprising resistance variable materials in a super-lattice structure and a number of portions of memory cells comprising resistance variable materials in a homogeneous structure. The portions of memory cells comprising resistance variable materials in a super-lattice structure can have higher endurance and higher programming speed than the portions of the memory cells comprising resistance variable materials in a homogeneous structure. The portions of the memory cells comprising resistance variable materials in a homogeneous structure can have better data retention properties and better thermal disturb properties than the portions of memory cells comprising resistance variable materials in a super-lattice structure.

In a number of embodiments, the array portions having memory cells comprised of resistance variable materials in a super-lattice structure can be used to store dynamic data, e.g. data that is programmed and/or erased more frequently than other data in an array, while the array portions having memory cells comprised of resistance variable materials in a homogeneous structure can be used to store static data, e.g., data that is programmed and/or erased less frequently than other data in an array. For example, system critical data, e.g. data that is used for proper operation of a memory device, can be stored in the portions of the memory cells comprised of resistance variable materials in a homogeneous structure due the better data retention properties of such memory cells.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more of such things. For example, a number of memory devices can refer to one or more memory devices. As used herein, the designators "N", "M", and "X", particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 210 may reference element "10" in FIG. 2, and a similar element may be referenced as 310 in FIG. 3. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate the embodiments of the present invention, and should not be taken in a limiting sense.

FIG. 1 is a perspective view of a portion of an array 100 of resistance variable memory cells 106 according to a number of embodiments of the present disclosure. In the example illustrated in FIG. 1, array 100 is a cross-point array having resistance variable memory cells 106 located at the intersections of a first number of conductive lines 102-1, 102-2, ..., 102-N (e.g., access lines, which may be referred to herein as word lines), and a second number of conductive lines 104-1, 104-2, ..., 104-M (e.g., data/sense lines, which may be referred to herein as bit lines). As illustrated in FIG. 1, word lines 102-1, 102-2, ..., 102-N are substantially parallel to each other and are substantially orthogonal to bit lines 104-1, 104-2, ..., 104-M, which are substantially parallel to each other; however, embodiments are not so limited. In the embodiment illustrated in FIG. 1, resistance variable memory cells 106 can function in a two-terminal architecture (e.g., with a particular word line 102-1, 102-2, ..., 102-N and bit line 104-1, 104-2, ..., 104-M serving as a bottom and top electrode for the cell 106).

Each resistance variable memory cell 106 can include a storage element (e.g., a resistance variable memory element) coupled (e.g., in series) to a select device (e.g., an access device). The access device can be, for example, a diode, a transistor (e.g., a field effect transistor (FET) or bipolar junction transistor (BJT)), or an ovonic threshold switch, among others. The storage element can include a programmable portion that may have a variable resistance, for example. For instance, the storage element can include one or more resistance variable materials (e.g., a material programmable to multiple different resistance states, which can represent multiple different data states) such as, for example, a transition metal oxide material, or a perovskite including two or more metals (e.g., transition metals, alkaline earth metals, and/or rare earth metals). Other examples of resistance variable materials that can be included in the storage element of resistance variable memory cells 106 can include various materials employing trapped charges to modify or alter conductivity, chalcogenides formed of various doped or undoped materials, binary metal oxide materials, colossal magnetoresistive materials, and/or various polymer based resistance variable variable materials, among others. Embodiments are not limited to a particular resistance variable material or materials. As such, resistance variable memory cells 106 can be single level and/or multilevel resistive random access memory (RRAM) cells, spin torque transfer random access memory (STT RAM) cells, programmable conductor memory cells, phase change random access memory (PCRAM) cells, magnetoresistive random access memory cells, and/or conductive-bridging random access memory (CBRAM) cells, among various other types of resistance variable memory cells.

In operation, resistance variable memory cells 106 of array 100 can be programmed via programming signals (e.g., write voltage and/or current pulses) applied to the cells (e.g., the storage element of the cells) via selected word lines 102-0, 102-1, ..., 102-N and bit lines 104-0, 104-1, ..., 104-M. The magnitude (e.g., amplitude), duration (e.g., width), and/or number of programming pulses, for example, applied to resistance variable memory cells 106 can be adjusted (e.g., varied) in order to program the cells to one of a number of different resistance levels corresponding to particular data states.

In a number of embodiments, a single level resistance variable memory cell may be programmed to one of two data states (e.g., logic 1 or 0). The memory cell may be programmed with a first programming signal, which will place the cell in a low resistance data state (e.g., logic 1) or the memory cell may be programmed with a second programming signal, which will place the cell in a relatively higher resistance data state (e.g., logic 0).

A sensing (e.g., read and/or program verify) operation can be used to determine the data state of a resistance variable memory cell 106 (e.g., the resistance state of the storage element of a resistance variable memory cell 106) by a sensing (e.g., read) signal, for example, on a bit line 104-0, 104-1, ..., 104-M associated with the respective cell responsive to a particular voltage applied to the selected word line 102-0, 102-1, ..., 102-N to which the selected cell is coupled. In a number of embodiments where memory cell 106 includes a 3-terminal select device, a word line voltage can be used to select the memory cell 106 and current through memory cell 106 can be changed by voltage difference between a bit line and a source of the selected memory cell 106 to vary the resistance level of the memory cell 106, for example.

In a number of embodiments, the bit lines 104-1 to 104-M and/or word lines 102-1 to 102-N can be grouped together as a number of different portions, e.g. sub-arrays. Any combination of memory cells of the array 100 can be grouped together as a number of different sub-arrays. For example, a sub-array can be comprised of one memory cell. Embodiments are not limited to a particular number of word lines and/or bit lines or a particular number of sub-arrays.

Figure 2A:
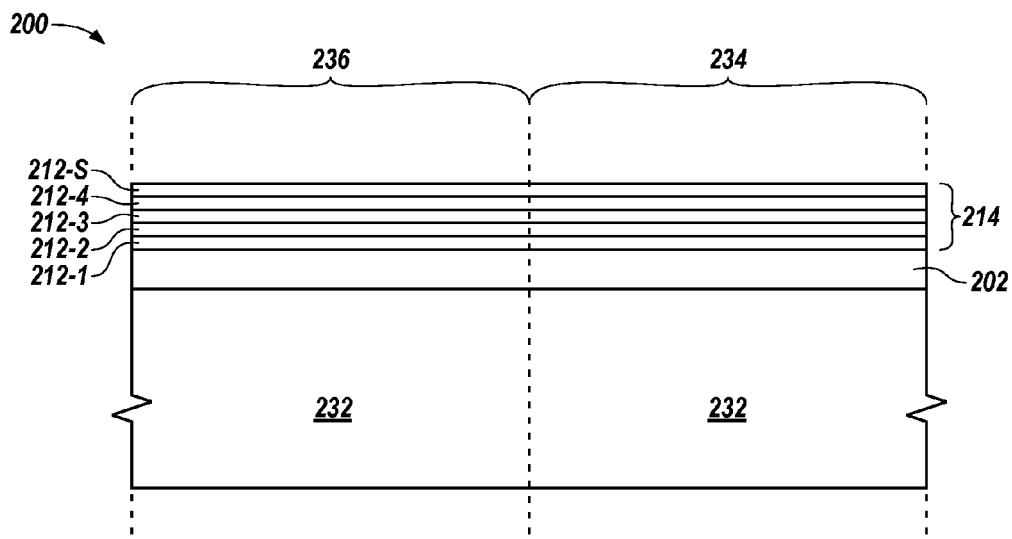
FIGS. 2A-2C illustrate various process stages associated with forming an array of resistance variable memory cells in accordance with a number of embodiments of the present disclosure.
Figure 2B:
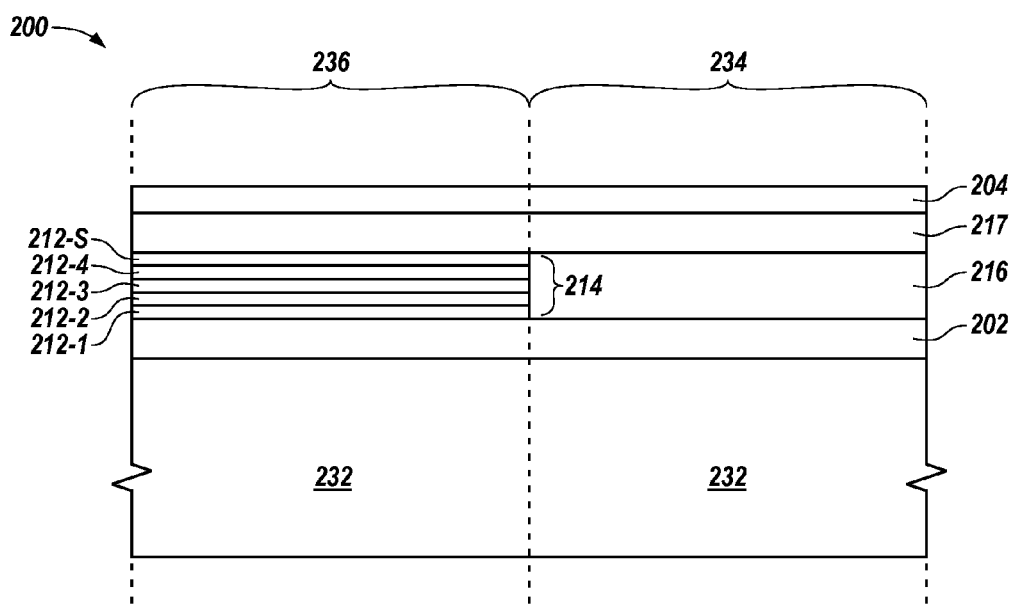
Figure 2C:
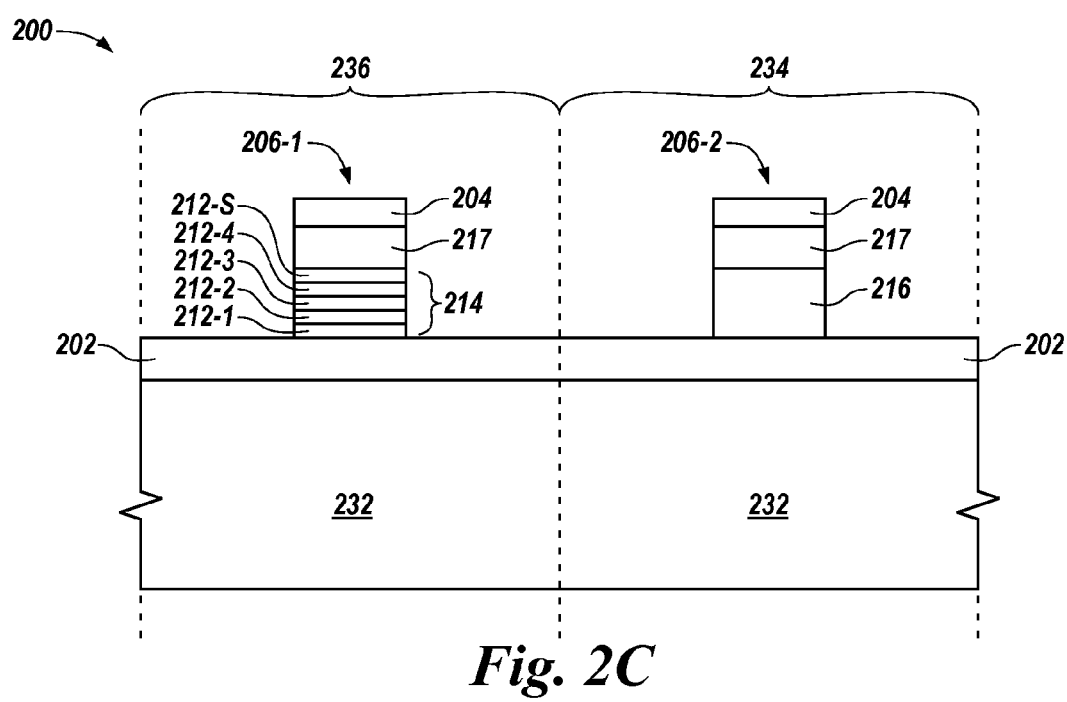

FIGS. 2A-2C illustrate various process stages associated with forming an array 200 of resistance variable memory cells in accordance with a number of embodiments of the present disclosure. The process illustrated in FIGS. 2A-2C can be used to form an array such as array 100 shown in FIG. 1, wherein a portion of the array includes memory cells having a super-lattice structure as a storage element and another portion of the array includes memory cells having a homogeneous structure as a storage element. The memory cells of array 200 can be resistance variable memory cells such as resistance variable memory cells 106, as described above. As an example, the array 200 can be an array of phase change memory cells.

FIG. 2A illustrates a first portion 234 and a second portion 236 of array 200. The array 200 includes substrate 232 that can be a silicon substrate, silicon on insulator (SOI) substrate, or silicon on sapphire (SOS) substrate, for instance, and can include various doped and/or undoped semiconductor materials. Conductive material 202 can be formed on the substrate 232. The conductive material 202 can be a metal, such as copper and/or tungsten, for example. The conductive material 202 can be a word line in the array 200, as word line 102 described above in association with FIG. 1. As used herein, a material being "formed on" another material is not limited to the materials being formed directly on each other. For instance, a number of intervening materials can be formed between a first material formed on a second material, in various embodiments.

A number of resistance variable material 212-1, 212-2, 212-3, 212-4, and 212-S, e.g., phase change materials, are formed on conductive material 202. That is, the conductive material 202 of regions 234 and 236 includes resistance variable materials 212-1, ..., 212-S formed thereon.

As illustrated in FIG. 2A, the resistance variable materials 212-1, ..., 212-S are formed as a super-lattice structure 214. The super-lattice structure 214 can include combinations of resistance variable materials 212-1, ..., 212-S. The resistance variable materials 212-1, ..., 212-S can be deposited using a physical vapor deposition (PVD) process and/or a sputtering process, among other deposition techniques. The super-lattice structure 214 is formed throughout the array 202, on both portion 234 and portion 236.

FIG. 2B illustrates a process stage subsequent to that shown in FIG. 2A and associated with forming array 202. FIG. 2B illustrates a homogeneous structure 216 formed in portion 234. Homogeneous structure 216 can be formed by performing an ion implant process and/or a laser anneal process on the super-lattice structure 214 illustrated in FIG. 2A in portion 234. Different storage element types of memory cells, e.g., super-lattice storage elements and homogeneous storage elements, can be formed in an array by selectively converting portions of the super-lattice 214 corresponding to particular memory cells or particular array portions. The ion implant process and/or laser anneal process performed on the super-lattice structure 214 in portion 234 from FIG. 2A can change the composition of the resistance variable materials 212-1, ..., 212-S from a super-lattice structure to a homogeneous structure 216 with a locally substantially uniform composition, as compared to a super-lattice structure 214.

Modifying the super-lattice structure 214 formed in portion 234 of array 200 to form homogeneous structure 216 in portion 234 of the array 200 can be used while forming memory cells in the array 200 that have different cell characteristics, e.g., electrothermal properties, within the respective array portions. Therefore, resistance variable memory cells formed in portion 234 can exhibit different cell characteristics as compared to the cell characteristics of memory cells formed in portion 236.

For instance, cells formed in a portion having a homogeneous structure as a storage element, e.g., portion 234, may exhibit a higher data retention as compared to cells formed in a portion having a super-lattice structure as a storage element, e.g., portion 236. Memory cells formed in a portion having a super-lattice structure as storage elements may exhibit a higher programming throughput as compared to cells formed in a portion having a homogeneous structure as storage elements, for instance.

As described further herein, resistance variable memory cells of portion 234 can be formed so as to exhibit different cell characteristics as compared to the resistance variable memory cells of portion 236. For instance, the cells of the portion 234 may include a homogeneous structure of resistance variable materials and the portion 236 may include a super-lattice structure of resistance variable materials resulting in respective portions 234 and 236 having different characteristics, e.g., different electrothermal properties, such that cell characteristics of the cells of the respective portions 234 and 236 are different.

In FIG. 2B, select device material 217 can be formed on homogeneous structure 216 in region 234 and on super-lattice structure 214 in region 236 and a conductive material 204 can be formed on the select device material 217. The conductive material 204 can be a metal, such as copper and/or tungsten, for example. The conductive material 204 can be a bit line in the array 200, such as bit line 104 described above in association with FIG. 1.

FIG. 2C illustrates a process stage subsequent to that shown in FIG. 2B and associated with forming array 200. The array illustrated in FIG. 2C may undergo additional process steps to form memory cells 206-1 and 206-2. For instance, individual resistance variable memory cells can be formed in portions 234 and 236 by removing portions of the conductive material 204, the select device material 217, the super-lattice structure 214, and/or the homogeneous structure 216, e.g., via masking and etching to isolate individual memory cells. In a number of embodiments, individual resistance variable memory cells include memory cells having the super-lattice structure 214 and/or the homogeneous structure 216 as a storage element and a select device 217 between a word line 202 and a bit line 204. In this example, the memory cells can be self-aligned and can be formed via a number of masking and etching processes, for instance.

In a number of embodiments, memory cells in portion 236 having a super-lattice structure can be modified to have a homogeneous structure. For example, a memory cell having a super-lattice structure can have a signal applied to the memory cell that provides a current sufficient to melt the super-lattice structure into a homogeneous structure. The method of applying a signal to change the super-lattice structure to a homogeneous structure can be used to convert portions of an array of memory cells from resistance variable memory cells with super-lattice structures to resistance variable memory cell with homogeneous structures after the array has been manufactured and/or while the array is part of a memory device that is in use or in testing.

In FIG. 2C, memory cell 206-1 includes a super-lattice structure 214 as a storage element and memory cell 206-2 includes a homogeneous structure 216 as a storage element. In a number of embodiments, memory cells having different cell structures can be located in different memory portions, e.g., different sub-arrays. In this example, the memory cell 206-1 is located in a first portion of the array, e.g., sub-array 236, and the memory cell 206-2 is located in a second portion of the array, e.g., sub-array 234.

The super-lattice structure 214 of memory cell 206-1 can include a number of portions of resistance variable materials 212-1, 212-2, 212-3, 212-4, and 212-S, e.g., phase change materials. The number of portions of resistance variable materials 212-1, ..., 212-S can include combinations of resistance variable materials formed into a super-lattice that provide properties to allow memory cell 206-1 to be written at a higher speed and more times than a memory cell without the super lattice structure 214, e.g., memory cells with a homogeneous structure. The memory cell 206-2 can include the resistance variable materials 212-1, ..., 212-S formed in a homogeneous structure 216 that can provide properties to allow memory cell 206-2 to have better data retention and thermal disturb properties than a memory cell without a homogeneous structure 216, e.g., memory cells with a super-lattice structure.

The super-lattice structure 214 of memory cell 206-1 can be formed by forming, e.g., depositing, various combinations of resistance variable materials 212-1, ..., 212-S. The super-lattice structure 214, and particular combinations of resistance variable materials 212-1, ..., 212-S thereof, can provide desirable memory cell characteristics, such as high endurance and high sensing and/or programming speed. However, such a super-lattice structure 214 may be more prone to thermal disturb and/or may have reduced data retention as compared to memory cells comprising a homogeneous structure. The homogeneous structure 216 of memory cell 206-2 can be formed by performing an ion implantation process and/or by melting a super-lattice structure, such as super lattice structure 214, for example. The homogeneous structure 216 can be formed to provide desirable memory cell characteristics for memory cells comprising the homogeneous structure 214, such as better data retention and better thermal disturb properties, as compared to memory cells comprising the super-lattice 214, for instance. Arrays of memory cells having a combination of memory cells 206-1 and 206-2, e.g., a combination of memory cells having a super-lattice structure and memory cells having a homogeneous structure, can provide portions that are particularly suited for stored certain different types of data. For example, a portion of an array having memory cells with a super-lattice structure can be particularly suited to store dynamic data and a portion of an array having memory cells with a homogeneous structure can be particularly suited to store static data. The portions having memory cells with super-lattice structures may be located throughout the array and may be adjacent to portions having memory cells with homogeneous structures. The portions having memory cells with homogeneous structures may be located throughout the array and may be adjacent to portions having memory cells with super-lattice structures.

Although the example shown in FIGS. 2A-2C is for an array of phase change memory cells, embodiments are not so limited. For instance, in a number of embodiments, the array 200 can be an array of RRAM cells or other resistance variable memory cells having separate regions with different cell characteristics.

Figure 3A:
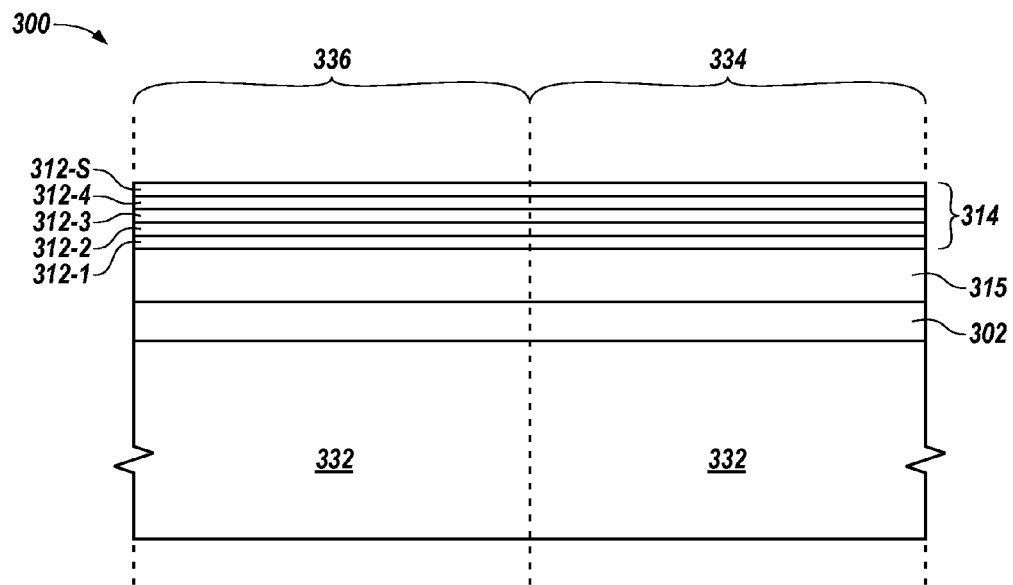
FIGS. 3A-3C illustrate various process stages associated with forming an array of resistance variable memory cells in accordance with a number of embodiments of the present disclosure.
Figure 3B:
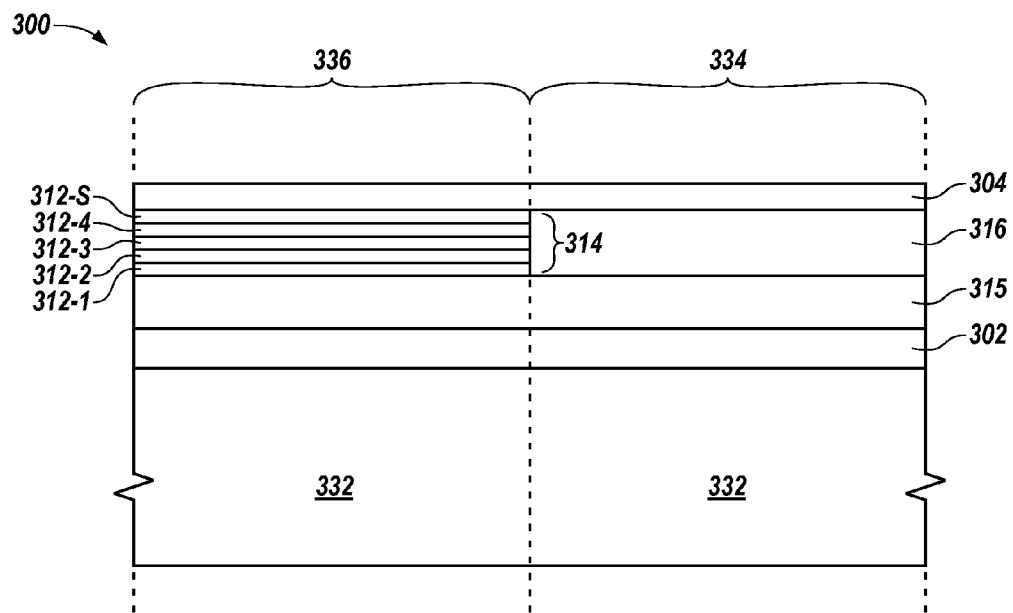
Figure 3C:
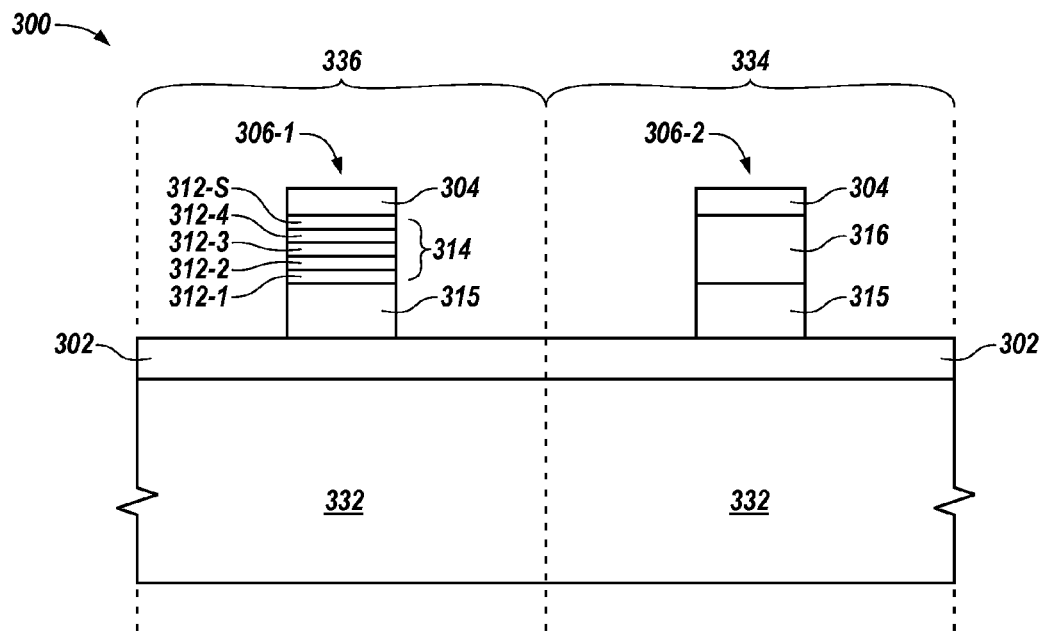

FIGS. 3A-3C illustrate various process stages associated with forming an array 300 of resistance variable memory cells in accordance with a number of embodiments of the present disclosure. The process illustrated in FIGS. 3A-3C can be used to form an array such as array 100 shown in FIG. 1, wherein a portion of the array includes memory cells having a super-lattice structure as a select device and another portion of the array includes memory cells having a homogeneous structure as a select device. The memory cells of array 300 can be resistance variable memory cells such as resistance variable memory cells 106, as described above. As an example, the array 300 can be an array of phase change memory cells.

FIG. 3A illustrates a first portion 334 and a second portion 336 of array 300. The array 300 includes substrate 332 that can be a silicon substrate, silicon on insulator (SOI) substrate, or silicon on sapphire (SOS) substrate, for instance, and can include various doped and/or undoped semiconductor materials. The conductive material 302 can be formed on the substrate 332. The conductive material can be a metal, such as copper and/or tungsten, for example. The conductive material 302 can be a word line in the array 300, as word line 102 described above in association with FIG. 1. Storage element material 315 can be formed on the conductive material 302. The storage element material 315 can form the storage element for the memory cells in array 300. As used herein, a material being "formed on" another material is not limited to the materials being formed directly on each other. For instance, a number of intervening materials can be formed between a first material formed on a second material, in various embodiments.

A number of resistance variable material 312-1, 312-3, 312-3, 312-4, and 312-S, e.g., phase change materials, are formed on storage element material 315. That is, the storage element material 315 of regions 334 and 336 includes resistance variable materials 312-1, ..., 312-S formed thereon.

As illustrated in FIG. 3A, the resistance variable materials 312-1, ..., 312-S are formed as a super-lattice structure 314. The super-lattice structure 314 can include combinations of resistance variable materials 312-1, ..., 312-S. The resistance variable materials 312-1, ..., 312-S can be deposited using a physical vapor deposition (PVD) process and/or a sputtering process, among other deposition techniques. The super-lattice structure 314 is formed throughout the array 300, on both portion 334 and portion 336.

FIG. 3B illustrates a process stage subsequent to that shown in FIG. 3A and associated with forming array 300. FIG. 3B illustrates a homogeneous structure 316 formed in portion 334. Homogeneous structure 316 can be formed by performing an ion implant process and/or a laser anneal process on the super-lattice structure 314 illustrated in FIG. 3A in portion 334. Different select device types of memory cells, e.g., super-lattice select devices and homogeneous select devices, can be formed in an array by selectively converting portions of the super-lattice structure 314 corresponding to particular memory cells or particular array portions. The ion implant process and/or laser anneal process performed on the super-lattice structure 314 in portion 334 from FIG. 3A can change the composition of the resistance variable materials 312-1, ..., 312-S from a super-lattice structure to a homogeneous structure 316 with a locally substantially uniform composition, as compared to a super-lattice structure 314.

Modifying the super-lattice structure 314 formed in portion 334 of array 300 to form homogeneous structure 316 in portion 334 of the array 300 can be used while forming memory cells in the array 300 that have select devices with different characteristics, e.g., electrothermal properties, within the respective array portions. Therefore, resistance variable memory cells formed in portion 334 can exhibit different cell characteristics as compared to the cell characteristics of memory cells formed in portion 336.

In FIG. 3B, conductive material 304 can be formed on the super-lattice structure 314 and the homogeneous structure 316. The conductive material 304 can be a metal, such as copper and/or tungsten, for example. The conductive material 304 can be a bit line in the array 300, such as bit line 104 described above in association with FIG. 1.

FIG. 3C illustrates a process stage subsequent to that shown in FIG. 3B and associated with forming array 300. The array illustrated in FIG. 3C may undergo additional process steps to form memory cells 306-1 and 306-2. For instance, individual resistance variable memory cells can be formed in portions 334 and 336 by removing portions of the conductive material 304, the select device material 315, the super-lattice structure 314, and/or the homogeneous structure 316, e.g., via masking and etching to isolate individual memory cells. In a number of embodiments, individual resistance variable memory cells include memory cells having the super-lattice structure 314 and/or the homogeneous structure 316 as a select device and a storage element 315 between a word line 302 and a bit line 304. In this example, the memory cells can be self-aligned and can be formed via a number of masking and etching processes, for instance.

In a number of embodiments, memory cells in portion 336 having a super-lattice structure can be modified to have a homogeneous structure. For example, a memory cell having a super-lattice structure as a select device can have a signal applied to the memory cell that provides a current sufficient to melt the super-lattice structure into a homogeneous structure. The method of applying a signal to change the super-lattice structure to a homogeneous structure can be used to convert portions of an array of memory cells from resistance variable memory cells with super-lattice structures as select devices to resistance variable memory cell with homogeneous structures as select devices after the array has been manufactured and/or while the array is part of a memory device that is in use.

In FIG. 3C, memory cell 306-1 includes a super-lattice structure 314 as a select device and memory cell 306-2 includes a homogeneous structure 316 as a select device. In a number of embodiments, memory cells having different cell structures can be located in different memory portions, e.g., different sub-arrays. In this example, the memory cell 306-1 is located in a first portion of the array, e.g., sub-array 336, and the memory cell 306-2 is located in a second portion of the array, e.g., sub-array 334.

The super-lattice structure 314 of memory cell 313-1 can include a number of portions of resistance variable materials 312-1, 312-2, 312-3, 312-4, and 312-S, e.g., phase change materials. The number of portions of resistance variable materials 312-1, . . . , 312-S can include combinations of resistance variable materials formed into a super-lattice that provide properties to allow memory cell 306-1 to be selected with different signals than a memory cell without the super lattice structure 314, e.g., memory cells with a homogeneous structure.

In a number of embodiments, an array of resistance variable memory cells can include a number of portions having memory cells with super-lattice structures and a number of portions having memory cells with homogeneous structures. The portions having memory cells with super-lattice structures may be located throughout the array and may be adjacent to portions having memory cells with homogeneous structures. The portions having memory cells with homogeneous structures may be located throughout the array and may be adjacent to portions having memory cells with super-lattice structures.

Although the example shown in FIGS. 3A-3C is for an array of phase change memory cells, embodiments are not so limited. For instance, in a number of embodiments, the array 300 can be an array of RRAM cells or other resistance variable memory cells having separate regions with different cell characteristics.

Figure 4:
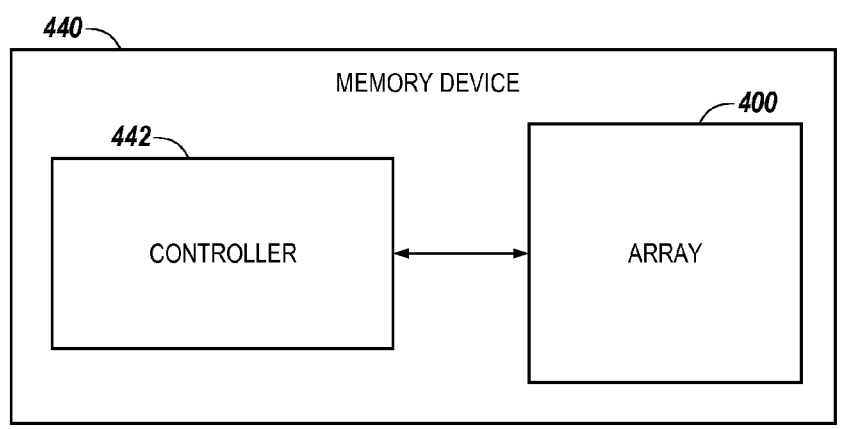
FIG. 4 illustrates a block diagram of an apparatus in the form of a memory device that includes an array of resistance variable memory cells according to a number of embodiments of the present disclosure.

FIG. 4 illustrates a block diagram of an apparatus in the form of a memory device 440 that includes an array 400 of resistance variable memory cells according to a number of embodiments of the present disclosure. The array 400 of resistance variable memory cells can be an array such as array 100 in FIG. 1, array 200 of FIGS. 2A-2C, and/or array 300 of FIGS. 3A-3C. As shown in FIG. 4, memory device 440 includes a controller 442 coupled to a memory array 400. As used herein, a memory system, a controller, or a memory device might also be separately considered an "apparatus." An "apparatus" can refer to, but is not limited to, any of a variety of structures or combinations of structures, such as a circuit or circuitry, a die or dice, a module or modules, a device or devices, or a system or systems, for example.

Memory array 400 can be analogous to, for example, memory array 100 previously described in connection with FIG. 1. Although one memory array is shown in FIG. 4, embodiments of the present disclosure are not so limited, e.g., memory device 440 can include more than one memory array coupled to controller 442.

Controller 442 can include, for example, control circuitry and/or firmware. Controller 442 can be included on the same physical device, e.g., the same die, as memory array 400, or can be included on a separate physical device that is communicatively coupled to the physical device that includes memory array 402.

Controller 442 can be used to control operation such that dynamic data is stored on the portions of the memory array 400 that include memory cells with a super-lattice structure, such as portion 236 shown in FIG. 2, and such that static data is stored on the portions of the memory array 400 that include memory cells with a homogeneous structure, such as portion 234 shown in FIG. 2. For example, the controller 442 can identify portions of data that are being accessed and/or modified repeatedly and move such data to a portion of the memory array 400 that includes memory cells with super-lattice structures. The controller 442 can identify system critical data, e.g. data that is used for proper operation of a memory device, and move such data to a portion of the memory array 400 that includes memory cells with homogeneous structures.

The embodiment illustrated in FIG. 4 can include additional circuitry that is not illustrated so as not to obscure embodiments of the present disclosure. For example, memory device 440 can include address circuitry to latch address signals provided over I/O connectors through I/O circuitry. Address signals can be received and decoded by a row decoder and a column decoder, to access memory array 400.

CONCLUSION

Resistance variable memory cell structures and methods are described herein. A number of embodiments include a first resistance variable memory cell comprising a number of resistance variable materials in a super-lattice structure and a second resistance variable memory cell comprising the number of resistance variable materials in a homogeneous structure.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An array of resistance variable memory cells, comprising:
a first resistance variable memory cell comprising a number of resistance variable materials in a super-lattice structure; and
a second resistance variable memory cell comprising the number of resistance variable materials in a homogeneous structure.

2. The array of claim 1, wherein the number of resistance variable materials include phase change materials.

3. The array of claim 1, wherein the number of resistance variable materials in the super-lattice structure include portions of each of the number of resistance variable materials stacked upon each other to form the super-lattice structure.

4. The array of claim 1, wherein the super-lattice structure is a storage element of the first resistance variable memory cell and the homogeneous structure is a storage element of the second resistance variable memory cell.

5. The array of claim 1, wherein the super-lattice structure is a select device of the first resistance variable memory cell and the homogeneous structure is a select device of the second resistance variable memory cell.

6. The array of claim 1, wherein the number of resistance variable materials in the homogeneous structure are ion implanted resistance variable materials.

7. The array of claim 1, wherein the first resistance variable memory cell is located in a first portion of the array configured to store a first type of data and the second resistance variable memory cell is located in a second portion of the array configured to store a second type of data.

8. An array of resistance variable memory cells, comprising:
a first number of resistance variable memory cells in a first portion of the array, wherein the first number of resistance variable memory cells each include a number of resistance variable materials having a super-lattice structure; and
a second number of resistance variable memory cells in a second portion of the array, wherein the second number of resistance variable memory cells each include the number of resistance variable materials having a homogeneous structure.

9. The array of claim 8, wherein the first portion of the array is configured to store a first type of data, and the second portion of the array is configured to store a second type of data.

10. The array of claim 8, wherein the second number of resistance variable memory cells have a higher associated retention capability than the first number of resistance variable memory cells.

11. The array of claim 8, wherein the first number of resistance variable memory cells have a higher associated programming throughput than the second number of resistance variable memory cells.

12. The array of claim 8, wherein the array is configured to store dynamic data in the first number of resistance variable memory cells and static data in the second number of resistance variable memory cells.

* * * * *